(12) United States Patent
Hsu et al.

(10) Patent No.: US 11,088,100 B2
(45) Date of Patent: Aug. 10, 2021

(54) SEMICONDUCTOR PACKAGE AND MANUFACTURING METHOD THEREOF

(71) Applicant: Powertech Technology Inc., Hsinchu County (TW)

(72) Inventors: Hung-Hsin Hsu, Hsinchu County (TW); Nan-Chun Lin, Hsinchu County (TW); Shang-Yu Chang Chien, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 0 days.

(21) Appl. No.: 16/513,726

(22) Filed: Jul. 17, 2019

(65) Prior Publication Data

US 2020/0273803 A1  Aug. 27, 2020

Related U.S. Application Data

(60) Provisional application No. 62/808,808, filed on Feb. 21, 2019.

(51) Int. Cl.
*H01L 23/00* (2006.01)
*H01L 23/29* (2006.01)
(Continued)

(52) U.S. Cl.
CPC .............. *H01L 24/09* (2013.01); *H01L 21/56* (2013.01); *H01L 21/565* (2013.01);
(Continued)

(58) Field of Classification Search
CPC ....... H01L 24/09; H01L 21/56; H01L 21/565; H01L 21/76877; H01L 21/76816;
(Continued)

(56) References Cited

U.S. PATENT DOCUMENTS 8,901,748 B2 * 12/2014 Manusharow .......... H01L 24/20
257/777
9,443,824 B1 * 9/2016 We ...................... H01L 23/5384
(Continued)

FOREIGN PATENT DOCUMENTS

CN       102738067    4/2017
TW       I575656      3/2017

OTHER PUBLICATIONS

"Office Action of Taiwan Counterpart Application", dated Apr. 15, 2020, p. 1-p. 5.

*Primary Examiner* — Dao H Nguyen
(74) *Attorney, Agent, or Firm* — JCIPRNET

(57) ABSTRACT

A semiconductor package and a manufacturing method thereof are provided. The semiconductor package includes a first and a second active dies separately arranged, an insulating encapsulation at least laterally encapsulating the first and the second active dies, a redistribution layer disposed on the insulating encapsulation, the first and the second active dies, and a fine-pitched die disposed on the redistribution layer and extending over a gap between the first and the second active dies. The fine-pitched die has a function different from the first and the second active dies. A die connector of the fine-pitched die is connected to a conductive feature of the first active die through a first conductive pathway of the redistribution layer. A first connecting length of the first conductive pathway is substantially equal to a shortest distance between the die connector of the fine-pitched die and the conductive feature of the first active die.

20 Claims, 7 Drawing Sheets

(51) Int. Cl.
  *H01L 23/31* (2006.01)
  *H01L 21/56* (2006.01)
  *H01L 21/768* (2006.01)
  *H01L 23/522* (2006.01)
  *H01L 23/538* (2006.01)
  *H01L 25/065* (2006.01)

(52) U.S. Cl.
  CPC .. *H01L 21/76816* (2013.01); *H01L 21/76877* (2013.01); *H01L 23/293* (2013.01); *H01L 23/3107* (2013.01); *H01L 23/5226* (2013.01); *H01L 23/5384* (2013.01); *H01L 23/5385* (2013.01); *H01L 23/5386* (2013.01); *H01L 23/5389* (2013.01); *H01L 25/0655* (2013.01); *H01L 2224/02372* (2013.01); *H01L 2224/04105* (2013.01)

(58) Field of Classification Search
  CPC .............. H01L 23/5384; H01L 23/5385; H01L 23/5386; H01L 23/5389; H01L 23/293; H01L 23/3107; H01L 23/5226; H01L 25/0655; H01L 2224/04105; H01L 2224/02372
  USPC ........ 257/774, 734, 737, 773, 666, E21.499, 257/E23.068, E23.085, E23.178, E25.012; 361/767, 814; 438/107, 108, 109, 121, 438/667
  See application file for complete search history.

(56) References Cited

U.S. PATENT DOCUMENTS

| | | | |
|---|---|---|---|
| 9,595,496 | B2 | 3/2017 | Lee et al. |
| 9,640,521 | B2 * | 5/2017 | Chang ..................... H01L 22/14 |
| 10,504,847 | B2 * | 12/2019 | Chang ..................... H01L 24/24 |
| 2017/0077022 | A1 * | 3/2017 | Scanlan ................... H01L 22/14 |
| 2017/0179078 | A1 * | 6/2017 | Jung ....................... H01L 25/50 |
| 2018/0366436 | A1 | 12/2018 | Wang et al. |
| 2020/0212006 | A1 * | 7/2020 | Chang ..................... H01L 24/18 |

* cited by examiner

SEMICONDUCTOR PACKAGE AND MANUFACTURING METHOD THEREOF

CROSS-REFERENCE TO RELATED APPLICATION

This application claims the priority benefit of U.S. provisional application Ser. No. 62/808,808, filed on Feb. 21, 2019. The entirety of the above-mentioned patent application is hereby incorporated by reference herein and made a part of this specification.

BACKGROUND OF THE INVENTION

Field of Invention

The present invention generally relates to a package structure and a manufacturing method thereof, and more particularly, to a fan-out semiconductor package and a manufacturing method thereof.

Description of Related Art

In recently years, electronic apparatus are more important for human's life. In order for electronic apparatus design to achieve being light, slim, short, and small, semiconductor packaging technology has kept progressing, in attempt to develop products that are smaller in volume, lighter in weight, higher in integration, and more competitive in market. Since the chip package technique is highly influenced by the development of integrated circuits, therefore, as the size of electronics has become demanding, so does the package technique. As such, miniaturizing the semiconductor package while maintaining the process simplicity has become a challenge to researchers in the field.

SUMMARY OF THE INVENTION

The disclosure provides a semiconductor package and a manufacturing method thereof, which provides improvement in electrical performance and greater manufacturability.

The disclosure provides a semiconductor package. The semiconductor package includes a first active die and a second active die separately arranged, an insulating encapsulation at least laterally encapsulating the first active die and the second active die, a redistribution layer disposed on the insulating encapsulation, the first active die, and the second active die, and a fine-pitched die disposed on the redistribution layer and extending over a gap between the first active die and the second active die. The fine-pitched die has a function different from the first active die and the second active die. A die connector of the fine-pitched die is connected to a conductive feature of the first active die through a first conductive pathway of the redistribution layer, where a first connecting length of the first conductive pathway of the redistribution layer is substantially equal to a shortest distance between the die connector of the fine-pitched die and the conductive feature of the first active die.

The disclosure provides a manufacturing method of a semiconductor package. The manufacturing method includes at least the following steps. A plurality of active dies is encapsulated with an insulating encapsulation, where the adjacent active dies are spatially separated by a portion of the insulating encapsulation. A redistribution layer is formed on the active dies and the insulating encapsulation. A fine-pitched die is disposed on the redistribution layer and above the portion of the insulating encapsulation, where die connectors of the fine-pitched die are bonded to a conductive pathway of the redistribution layer. A connecting length of the conductive pathway between one of the die connectors and one of the active dies is substantially equal to a shortest distance between the one of the die connectors and the one of the active dies.

Based on the above, since the semiconductor package includes the active dies and the fine-pitched die disposed in a face-to-face configuration for shortening interconnection distance therebetween, and the lower power consumption and high bandwidth of the semiconductor package may be achieved. The fine-pitched die may be utilized to provide a high density input/output (I/O) communication to interconnect the adjacent active dies. By using the manufacturing method above, homogeneous die and heterogeneous die may be integrated in a single fan-out package.

To make the above features and advantages of the present disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF EMBODIMENTS

Figure 1A:
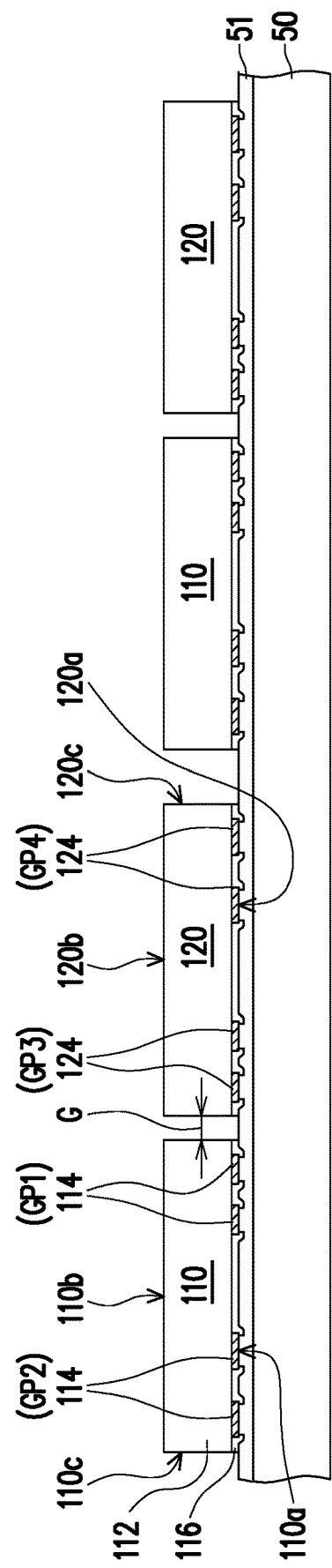
FIG. 1A to FIG. 1F are schematic cross-sectional views illustrating a manufacturing method of a semiconductor package according to an embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

FIG. 1A to FIG. 1F are schematic cross-sectional views illustrating a manufacturing method of a semiconductor package according to an embodiment of the disclosure. Referring to FIG. 1A, a first active die 110 and a second active die 120 are disposed side by side over a temporary carrier 50. Throughout the description, the term "active die" may refer to a semiconductor die (or a semiconductor chip) having electrical function(s) that may contribute to the electrical operation of the resulting semiconductor package. The temporary carrier 50 may be a wafer-level or panel-level substrate made of glass, plastic, metal, or other suitable materials as long as the material is able to withstand the subsequent processes while carrying the structure formed thereon. In some embodiments, a plurality of first active dies 110 and a plurality of second active dies 120 are arranged in an array (e.g., alternately disposed) over the temporary carrier 50. In some embodiments, the first active dies 110 and/or the second active dies 120 are singulated from device wafer(s) (not shown), and then separately arranged on the temporary carrier 50.

The first active die 110 may include an active surface 110a, a back surface 110b opposite to the active surface 110a, and a sidewall 110c connected to the active surface and the back surface 110b. Similarly, the second active die 120 may include the active surface 120a, the back surface 120b, and the sidewall 120c. In some embodiments, after disposing the first active die 110 and the second active die 120, a gap G is formed between the first active die 110 and the second active die 120. For example, the gap G is a shortest distance between the sidewall 110c of the first active die 110 and the sidewall 120c of the second active die 120. In some embodiments, the gap G is in a range from about 50 μm to about 300 μm.

In some embodiments, when disposing the first active die 110 and the second active die 120, the active surface 110a of the first active die 110 and the active surface 120a of the second active die 120 face towards the temporary carrier 50. For example, the active surface 110a of the first active die 110 and the active surface 120a of the second active die 120 are bonded to the temporary carrier 50 through a de-bonding layer 51. For example, the de-bonding layer 51 includes a light to heat conversion (LTHC) release layer or other suitable release layer which may enhance the releasability of the first active die 110 and the second active die 120 from the temporary carrier 50 in the subsequent processes. Alternatively, the de-bonding layer 51 is omitted.

In some embodiments, the first active die 110 includes a semiconductor substrate 112 including semiconductor devices (e.g., transistors, capacitors, inductors, resistors, etc.; not shown) formed therein, a plurality of contact pads 114 disposed over the semiconductor substrate 112 and electrically coupled to the semiconductor devices, and a passivation layer 116 disposed over the semiconductor substrate 112 and partially covering the contact pads 114. The semiconductor substrate 112 may be made of semiconductor materials, and may include bulk silicon, doped or undoped, or an active layer of a silicon-on-insulator substrate, or the like. The contact pads 114 may include aluminum, but other conductive materials (e.g., copper), may alternatively be used. The passivation layer 116 may be a polymer layer in order to provide protection and isolation for the underlying structures. At least a portion of the contact pads 114 may be exposed by the passivation layer 116 for further electrical connection.

In some embodiments, the first active die 110 is a bumpless die, and the surface (e.g., where the contact pads 114 are distributed and exposed) may be viewed as the active surface 110a for connecting to external components. The term "bumpless" may refer to the absence of conductive bumps on the contact pads 114 when the first active die 110 is initially provided. Alternatively, the first active die includes conductive bumps formed on the contact pads. In such embodiments, the active surface of the first active die may refer to the surface where the conductive bumps are distributed on for connecting to external components. In some embodiments, a first group GP1 of the contact pads 114 is distributed at a peripheral region of the active surface 110a of the first active die 110, where the peripheral region of the active surface 110a is the region proximal to the second active die 120. A second group GP2 of the contact pads 114 may be distributed at the rest region other than the peripheral region of the active surface 110a. In some embodiments, a pitch of two adjacent contact pads 114 in the first group GP1 is finer than a pitch of two adjacent contact pads 114 in the second group GP2.

The second active die 120 may have similar components and/or configurations to the first active die 110. For example, a third group GP3 of the contact pads 124 is distributed at a peripheral region of the active surface 120a of the second active die 120, where the peripheral region of the active surface 120a is the region close to the first active die 110. The first group GP1 of the first active die 110 and the third group GP3 of the second active die 120 may be proximal to each other, and the contact pads 114 in the first group GP1 and the contact pads 124 in the third group GP3 may have the same or similar fine pitches. A fourth group GP4 of the contact pads 124 may be distributed at the rest region other than the peripheral region of the active surface 120a, and the contact pads 114 in the second group GP2 and the contact pads 124 in the fourth group GP4 may have the same or similar fine pitches.

The first active die 110 and the second active die 120 may be homogeneous dies (i.e., identical dies) or heterogeneous dies (i.e., distinct dies). For example, the first active die 110 and the second active die 120 includes memory dies, logic dies, central processing unit (CPU) dies, combinations of these, or the like. Other types or functions of dies may be employed depending on the required functionality of the resulting semiconductor package, which are not limited thereto.

Figure 1B:
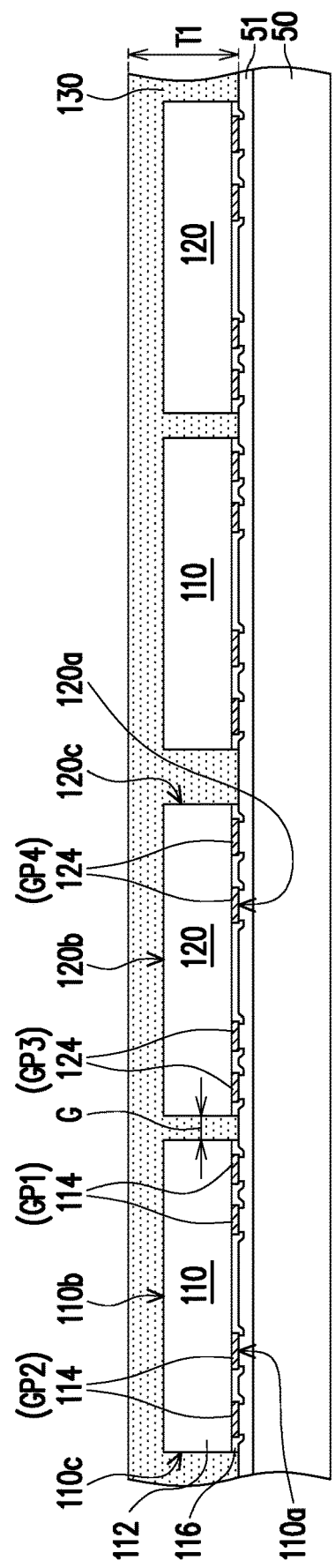

Referring to FIG. 1B, an insulating encapsulation 130 is formed over the temporary carrier 50 to encapsulate the first active die 110 and the second active die 120. In some embodiments, a thickness T1 of the insulating encapsulation 130 is greater than thicknesses of the first active die 110 and the second active die 120. For example, the sidewalls 110c and the back surface 110b of the first active die 110 and the sidewalls 120c and the back surface 120b of the second active die 120 are covered by the insulating encapsulation 130. The insulating encapsulation 130 may be rigid enough to protect the first active die 110 and the second active die 120. In some embodiments, the insulating encapsulation 130 includes epoxy resin, a molding compound, a molding underfill, or other suitable electrical insulating materials. The insulating encapsulation 130 may be formed by a molding process or other suitable forming process.

For example, after formation, the first active die 110 and the second active die 120 are surrounded by the insulating encapsulation 130, and a portion of the insulating encapsulation 130 is formed in the gap G between the first active die 110 and the second active die 120 to spatially separate the first active die 110 from the second active die 120. In other embodiments, the insulating encapsulation 130 is thinned to be substantially leveled with the back surfaces 110b and 120b of the first active die 110 and the second active die 120 by using, for example, grinding, chemical-mechanical polishing (CMP), etching, combinations thereof, etc.

Figure 1C:
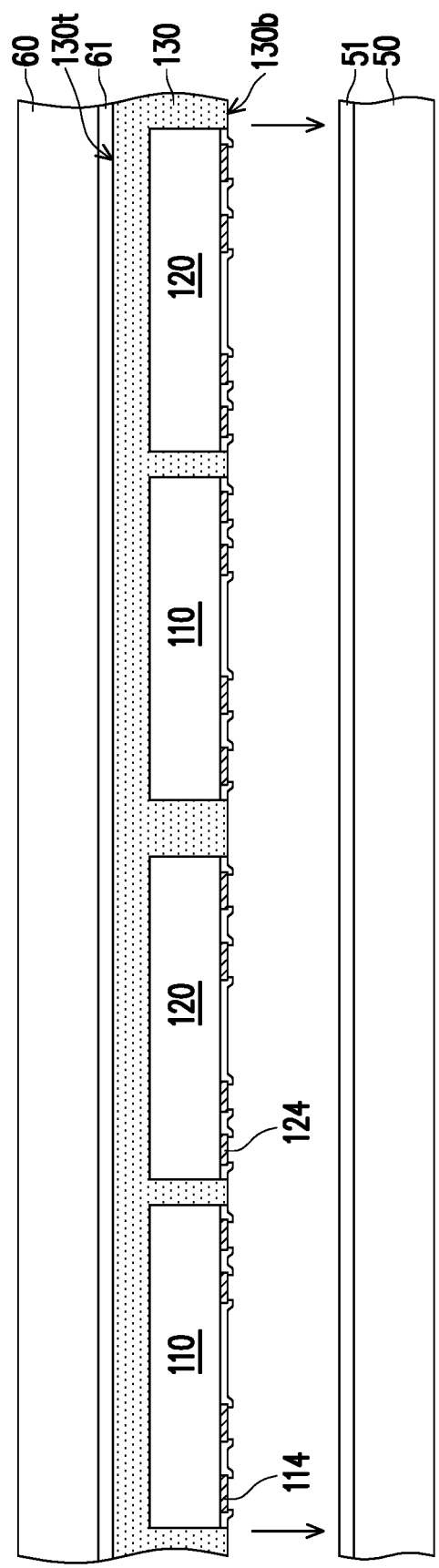

Referring to FIG. 1C, the temporary carrier 50 is removed from the first active die 110, the second active dies 120, and the insulating encapsulation 130. For example, after removing the temporary carrier 50, the bottom surface 130b of the insulating encapsulation 130, the contact pads 114 of the first active die 110, and the contact pads 124 of the second active die 120 are exposed for further processing. For example, the external energy (e.g., UV laser, visible light or heat) may be applied to the de-bonding layer 51 so that the first active die 110, the second active dies 120, and the insulating encapsulation 130 may be de-bonded from the temporary carrier 50. Other suitable removal process (e.g., mechanical peeling, etching, etc.) may be employed to remove the temporary carrier 50.

The temporary carrier 60 is bonded to the insulating encapsulation 130 opposite to the temporary carrier 50. In some embodiments, the top surface 130t of the insulating encapsulation 130 is boned to the temporary carrier 60 through the de-bonding layer 61. The materials of the temporary carrier 60 and the de-bonding layer 61 may be similar to the materials of the temporary carrier 50 and the de-bonding layer 51. The temporary carrier 60 is bonded to the insulating encapsulation 130 prior to removal of the temporary carrier 50. In other embodiments, the bonding process of the temporary carrier 60 is performed after removing the temporary carrier 50. Alternatively, the insulating encapsulation 130 is rigid enough to protect the first active die 110 and the second active die 120 during the subsequent processes, and the bonding process of the temporary carrier 60 is omitted.

Figure 1D:
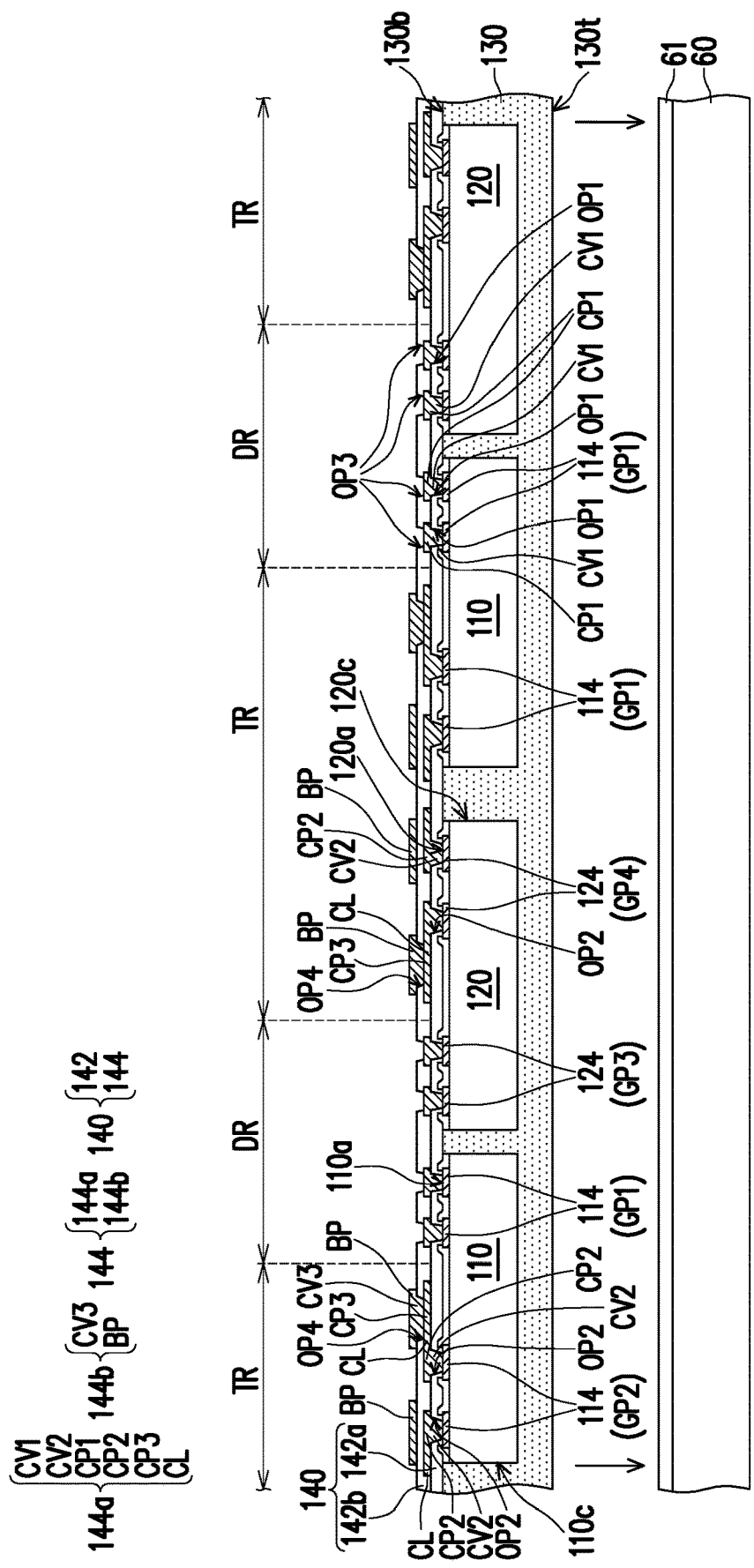

Referring to FIG. 1D, a redistribution layer (RDL) 140 is formed on the insulating encapsulation 130, the first active die 110, and the second active die 120. In some embodiments, after removing the temporary carrier 50, the structure may be flipped upside down for forming the RDL 140 on the active surfaces of the active dies. The RDL 140 may include a die-mounting region DR and a terminal-mounting region TR surrounding the die-mounting region DR. For example, the die-mounting region DR overlaps the first group GP1 of the first active die 110, the portion of the insulating encapsulation 130 formed in the gap G, and the third group GP3 of the second active die 120. In some embodiments, the RDL 140 includes at least one patterned dielectric layer and at least one patterned conductive layer alternately stacked upon one another.

In an exemplary embodiment, forming the RDL 140 at least includes the following steps. A dielectric material may be formed on the bottom surface 130*b* of the insulating encapsulation 130 and extends to cover the first active die 110 and the second active die 120 by using, for example, spin-coating or other suitable deposition process. Next, a portion of the dielectric material is removed to form a first patterned dielectric layer 142*a* with first openings OP1 and second openings OP2 by using, for example, lithography and etching processes or other suitable removal techniques. The first openings OP1 may be formed within the die-mounting region DR, and the second openings OP2 may be formed within the terminal-mounting region TR. For example, at least a portion of the contact pads 114 in the first group GP1 of the first active die 110 and at least a portion of the contact pads 124 in the third group GP3 of the second active die 120 may be exposed by the first openings OP1, and at least a portion of the contact pads 114 in the second group GP2 of the first active die 110 and at least a portion of the contact pads 124 in the fourth group GP4 of the second active die 120 may be exposed by the second openings OP2.

Next, conductive materials are formed and patterned on the first patterned dielectric layer 142*a* and inside the first openings OP1 and the second openings OP2 to form a first patterned conductive layer 144*a* by using, for example, spin coating of a photoresist, lithography and etching the photoresist, plating conductive materials, and stripping the photoresist, or any other suitable processes. It should be noted that the first patterned conductive layer 144*a* may be formed before the first patterned dielectric layer 142*a* in other embodiments.

For example, the first patterned conductive layer 144*a* includes conductive vias CV1 and CV2 respectively formed in the first openings OP1 and the second openings OP2 of the first patterned dielectric layer 142*a*, conductive pads CP1 and CP2 respectively connected to the conductive vias CV1 and CV2, conductive lines CL connected to the conductive vias CV2 and extending on the first patterned dielectric layer 142*a* for rerouting the distribution layout. The first patterned conductive layer 144*a* optionally includes conductive pads CP3 connected to the conductive lines CL, where conductive vias of the next level (e.g., second conductive layer 144*b*) may land on the conductive pads CP3. The conductive vias CV1 and the conductive pads CP1 formed thereon may be formed within the die-mounting region DR. The conductive vias CV2, the conductive pads CP2 formed on the conductive vias CV2, the conductive lines CL connected to the conductive pads CP2, and the optional formed conductive pads CP3 may be formed within the terminal-mounting region TR. For example, the conductive vias CV1 and CV2 are arranged to vertically route the electrical signals between adjacent levels stacked vertically, and the conductive lines CL are arranged to horizontally route the electrical signals to extend beyond the given area or narrow down to the given area.

In some embodiments, portions of the conductive vias CV2 of the first patterned conductive layer 144*a* are laterally covered by the first patterned dielectric layer 142*a* and physically connected to the contact pads 114 in the second group GP2. Electrical signals of the first active die 110 are transmitted to or from the external electrical component (e.g., subsequently mounted die) through the conductive vias CV2 directly formed on the contact pads 114 in the second group GP2. The electrical signals passing through the conductive vias CV2 landing on the contact pads 114 in the second group GP2 may be expanded laterally beyond the sidewalls 110*c* of the first active die 110 away from the second active die 120 (or may be extended laterally towards the second active die 120) through the conductive pads CP2, the conductive lines CL, and optional formed conductive pads CP3. In some embodiments, the conductive vias CV1 of the first patterned conductive layer 144*a* are laterally covered by the first patterned dielectric layer 142*a* and physically connected to the contact pads 114 in the first group GP1. Electrical signals of the first active die 110 are transmitted to or from the external electrical component through the conductive vias CV1 formed on the contact pads 114 in the first group GP1. The electrical signals passing through the conductive vias CV1 landing on the contact pads 114 in the first group GP1 may be vertically transmitted to or from the external electrical component through the conductive pads CP1 physically connected to the corresponding conductive vias CV1, and the electrical signals passing through the conductive pads CP1 may not be expanded laterally by any conductive line.

Similarly, portions of the conductive vias CV2 of the first patterned conductive layer 144*a* are laterally covered by the first patterned dielectric layer 142*a* and physically land on the contact pads 124 in the fourth group GP4. Electrical signals of the second active die 120 are transmitted to or from the external electrical component through the conductive vias CV2 directly formed on the contact pads 124 in the fourth group GP4. The electrical signals passing through the conductive vias CV2 landing on the contact pads 124 in the fourth group GP4 may be expanded laterally beyond the sidewalls 120*c* of the second active die 120 away from the first active die 110 (or may be extended laterally towards the first active die 110) through the conductive pads CP2, the conductive lines CL, and optional formed conductive pads CP3. The conductive vias CV1 of the first patterned conductive layer 144*a* are laterally covered by the first patterned dielectric layer 142*a* and physically connected to the contact pads 124 in the third group GP3. Electrical signals of the second active die 120 are transmitted to or from the external electrical component through the conductive vias CV1 formed on the contact pads 124 in the third group GP3. The electrical signals passing through the conductive vias CV1 landing on the contact pads 124 in the third group GP3 may be vertically transmitted to or from the external electrical component through the conductive pads CP1 physically connected to the corresponding conductive vias CV1, and the electrical signals passing through the conductive pads CP1 may not be expanded laterally by any conductive line.

Subsequently, a second patterned dielectric layer 142b may be formed on the first patterned dielectric layer 142a to cover the first patterned conductive layer 144a. The second patterned dielectric layer 142b may include third openings OP3 and fourth openings OP4. The third openings OP3 may be formed within the die-mounting region DR, and the fourth openings OP4 may be formed within the terminal-mounting region TR. For example, at least a portion of the conductive pads CP1 may be exposed by the third openings OP3, and at least a portion of the conductive pads CP3 may be exposed by the fourth openings OP4. In some embodiments, the openings size of the third opening OP3 is less than the opening size of the fourth opening OP4 as desired for a particular functionality. The pitch of two adjacent third openings OP3 may be finer than the pitch of two adjacent fourth openings OP4. It should be appreciated that the opening sizes and the pitches of the third openings OP3 and the fourth openings OP4 may be adjusted depending on the design requirements.

A second patterned conductive layer 144b is formed on the second patterned dielectric layer 142b and inside the fourth openings OP4 to be electrically connected to the first patterned conductive layer 144a. The forming processes of the second patterned dielectric layer 142b and the second patterned conductive layer 144b may be similar to those of the first patterned dielectric layer 142a and the first patterned conductive layer 144a. The first patterned dielectric layer 142a and the second patterned dielectric layer 142b may be collectively viewed as the patterned dielectric layer 142 of the RDL 140, and the first patterned conductive layer 144a and the second patterned conductive layer 144b may be collectively viewed as the patterned conductive layer 144 of the RDL 140. Alternatively, the second patterned conductive layer 144b is omitted. It should be noted that the number of the patterned dielectric layer and the patterned conductive layer illustrated in FIG. 1D merely serves as an example, in some embodiments, the abovementioned steps are performed multiple times to obtain a multi-layered redistribution structure as required by the circuit design. It should be appreciated that a better warpage control may be achieved and manufacturing cost may be reduced by forming less patterned dielectric layers and patterned conductive layers.

In some embodiments, the second patterned conductive layer 144b is not formed within the die-mounting region DR, but formed within the terminal-mounting region TR. For example, the second patterned conductive layer 144b includes conductive vias CV3 physically and electrically connected to the conductive pads CP3 of the first patterned conductive layer 144a, and bond pads BP connected to the conductive vias CV3 and extending on the second patterned dielectric layer 142b. The bond pads BP may be under-ball metallurgy (UBM) pads for a ball mounting process. In other embodiment in which the second patterned conductive layer 144b is omitted, the conductive pads CP3 of the first patterned conductive layer 144a may be UBM pads for ball mounting. In some embodiments, the second patterned conductive layer 144b is not formed in the third openings OP3 of the second patterned dielectric layer 142b, so that the conductive pads CP1 of the first patterned conductive layer 144a are remained exposed by third openings OP3.

Still referring to FIG. 1D, in some embodiments in which the temporary carrier 60 is bonded to the insulating encapsulation 130, after forming the RDL 140, the temporary carrier 60 is de-bonded from the insulating encapsulation 130. The de-bonding process of the temporary carrier 60 may be similar to the de-bonding process of the temporary carrier 50 described in FIG. 1C, so the detailed descriptions are not repeated for brevity.

Figure 1E:
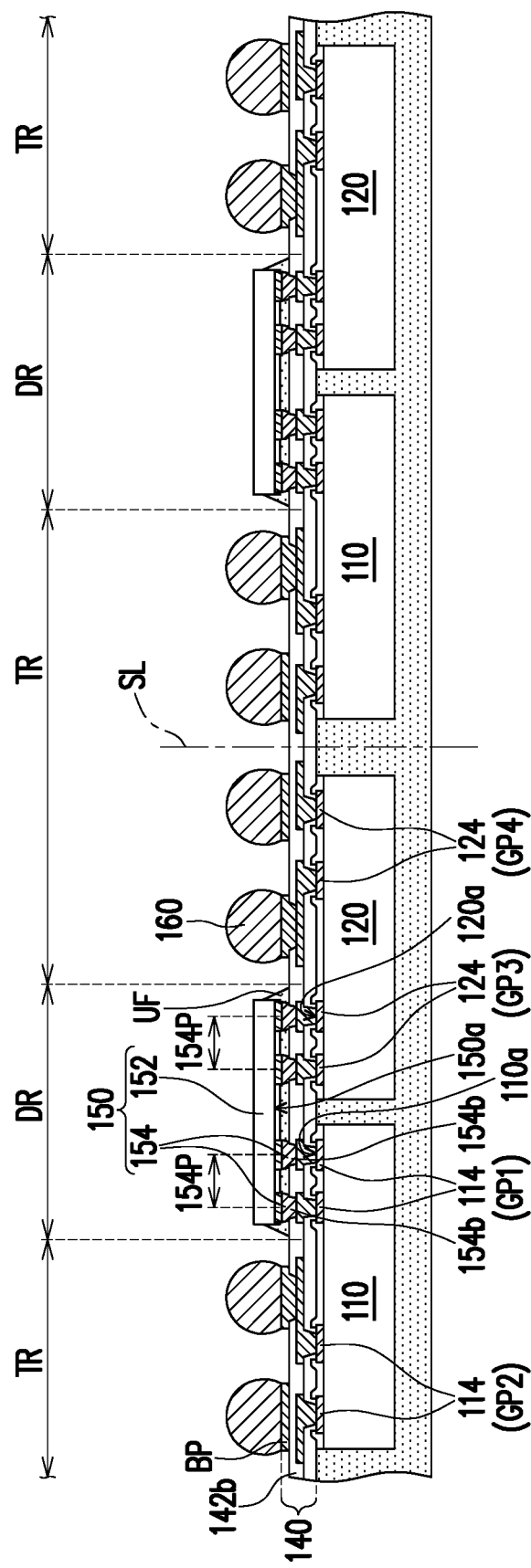

Referring to FIG. 1E, a fine-pitched die 150 is disposed on the RDL 140 opposite to the first active die 110 and the second active die 120. The fine-pitched die 150 may include an active surface 150a and a plurality of die connectors 154 distributed on the active surface 150a in high density. For example, the distribution density of the die connectors 154 distributed on the active surface 150a is denser than a distribution density of the contact pads 114 in the second group GP2 distributed on the active surface 110a of the first active die 110 or is denser than a distribution density of the contact pads 124 in the fourth group GP4 distributed on the active surface 120a of the second active die 120. The fine-pitched die 150 is disposed on the RDL 140 and within the die-mounting region DR, and the active surface 150a of the fine-pitched die 150 faces towards the active surfaces 110a and 120a of the first active die 110 and the second active die 120. For example, the fine-pitched die 150 includes a semiconductor substrate 152, an interconnecting layer (not shown) formed on the semiconductor substrate 152, and a plurality of die connectors 154 formed on the interconnecting layer. The material of the semiconductor substrate 152 may be similar to that of the semiconductor substrate of the first active die 110. The interconnecting layer may be formed to provide a connecting route between different ones of the die connectors 154.

For example, the die connectors 154 may be fine-pitched contact bumps (e.g., copper bumps, solder bumps, or the like). The die connectors 154 may include conductive materials such as copper, gold, tin, silver, solder, metal alloy, combinations of these, or other suitable materials. In some embodiments, the pitch 154P of two adjacent die connectors 154 is in a range from about 20 μm to about 60 μm. For example, the pitch 154P is substantially equal to the pitch of two adjacent contact pads 114 in the first group GP1 of the first active die 110 or the pitch of two adjacent contact pads 124 in the first group GP3 of the second active die 120. The first active die 110 is disposed in close enough proximity to the second active die 120 so as to allow the contact pads 114 in the first group GP1 of the first active die 110 and the contact pads 124 in the first group GP3 of the second active die 120 to be electrically interconnected through the first patterned conductive layer 144a within the die-mounting region DR and the die connectors 154 of the fine-pitch die 150, thereby achieving better signal integrity and lower transmission loss.

The fine-pitched die 150 may be mounted on the RDL 140 through a flip chip bonding process or other suitable bonding process. For example, the die connectors 154 of the fine-pitched die 150 are bonded to the first patterned conductive layer 144a. In some embodiments in which the die connectors 154 includes solder caps or solder bumps, a reflow process is performed on the solder material for enhancement of the adhesion between the die connectors 154 and the conductive pads CP1 of the first patterned conductive layer 144a. After reflowing, the bottoms 154b of the die connectors 154 are laterally covered by the second patterned dielectric layer 142b and physically connected to the conductive pads CP1 of the first patterned conductive layer 144a. In other embodiments in which the solder material is not initially formed on the die connectors 154, the solder material may be deposited on the conductive pads CP1 of the first patterned conductive layer 144a and within the in the third opening OP3 of the second patterned dielectric layer 142b, and then a reflow process is performed on the solder material. Other conductive paste may be employed to replace the solder material.

In some embodiments, after bonding the fine-pitched die 150 to the RDL 140, the bottoms of the die connectors 154 (e.g., solder material portions) are embedded in the second patterned dielectric layer 142b, and the rest portions of the die connectors 154 are exposed by the second patterned dielectric layer 142b. An underfill UF may be formed on the RDL 140 to at least laterally cover the rest portions of the die connectors 154 unmasked by the second patterned dielectric layer 142b by using, for example, dispensing, injecting, or other suitable process. The underfill UF formed between the fine-pitched die 150 and the RDL 140 may enhance the reliability of the bonding process. Alternatively, the underfill UF is omitted.

The fine-pitched die 150 may be a non-active die. In some embodiments, the fine-pitched die 150 including fine-pitched die connectors 154 is attached to the RDL 140 in order to provide a high-density interconnect pathway to interconnect the first active die 110 and the second active die 120. For example, the fine-pitched die 150 is a bridge die for interconnecting the first active die 110 and the second active die 120, and the bridge die does not contribute to the electrical operation of the resulting package. In other embodiments, the fine-pitched die 150 includes passive devices (e.g., resistors, inductor, and capacitor) built in the semiconductor substrate 152. The shortest electrical connecting path linking the first active die 110 and the second active die 120 may be achieved by using the fine-pitched die 150.

Continue to FIG. 1E, a plurality of conductive terminals 160 is formed on the RDL 140 and aside the fine-pitched die 150. For example, the conductive terminals 160 are formed on the bond pads BP and within the terminal-mounting region TR of the RDL 140. In some embodiments, the fine-pitched die 150 is surrounded by the conductive terminals 160. The conductive terminals 160 may be electrically coupled to the first active die 110 and the second active die 120 through the RDL 140. The conductive terminals 160 may be electrically coupled to the fine-pitched die 150 providing particular functionality through the RDL 140. Alternatively, the conductive terminals 160 are not electrically coupled to the fine-pitched die 150.

For example, the conductive terminals 160 are formed by using a ball mounting process, a plating process or other suitable process. In some embodiments, the conductive terminals 160 are solder balls formed by ball mounting process, thereby reducing manufacturing cost and improving manufacturing efficiency. Other possible forms and shapes of the conductive terminals 160 may be used according to the design requirement. For example, a soldering process and an optional reflowing process may be performed for enhancement of the adhesion between the conductive terminals 160 and the bond pads BP of the RDL 140. The conductive terminals 160 may be formed after disposing the fine-pitched die 150. Alternatively, the conductive terminals 160 may be formed prior to disposing the fine-pitched die 150.

Figure 1F:
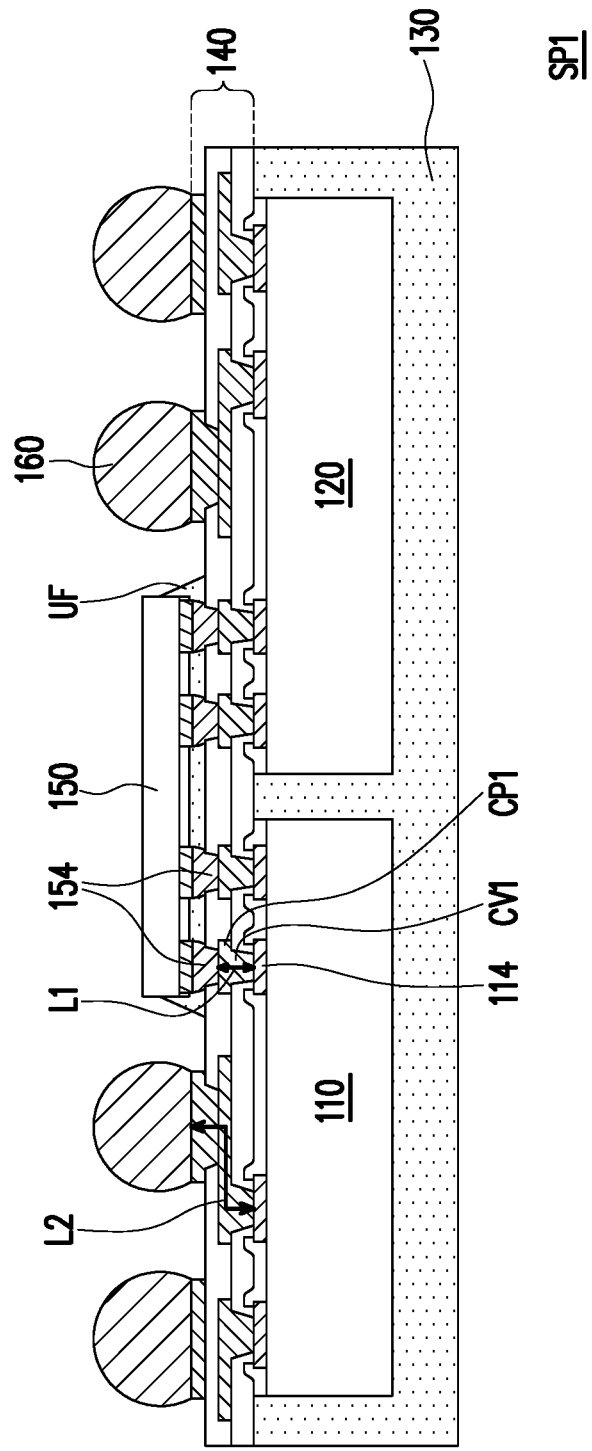

Referring to FIG. 1E and FIG. 1F, after disposing the fine-pitched die 150 and forming the conductive terminals 160, a singulation process is performed to form a plurality of semiconductor packages SP1. For example, a dicing tool (not shown) may cut through the RDL 140 and the underlying insulating encapsulation 130 along scribe lines SL to separate the structures from one another. Up to here, the manufacturing process of the semiconductor package SP1 is substantially completed. In some embodiments, the semiconductor package SP1 is referred to as a fan-out semiconductor package, and the RDL 140 is referred to as a fan-out RDL.

As shown in FIG. 1F, the semiconductor package SP1 includes the fine-pitched die 150 which provides a high-density interconnect pathway to interconnect the first active die 110 and the second active die 120. The semiconductor package SP1 may have homogeneous and heterogeneous dies (e.g., the fine-pitched die 150, the first active die 110, and the second active die 120) integrated therein. The fine-pitched die 150 having high density of the die connectors 154 coupled to the first active die 110 and the second active die 120 may provide better electrical performance to the semiconductor package SP1 during operation. The die connector 154 of the fine-pitched die 150 is coupled to the first active die 110 through the conductive via CV1 and the conductive pad CP1 of the first patterned conductive layer 144a of the RDL 140 (i.e. a first conductive pathway). The conductive terminal 160 is coupled to the first active die 110 through a second conductive pathway of the RDL 140 (e.g., conductive via CV2, conductive pad CP2, conductive line CL, conductive pad CP3, conductive via CV3, bond pad BP). A first connecting length L1 of the first conductive pathway is shorter than a second connecting length L2 of the second conductive pathway.

Since the conductive via CV1 is directly connected to the contact pad 114 of the first active die 110 and the die connector 154 of the fine-pitched die 150 is directly bonded to the conductive pad CP1, the first connecting length L1 of the first conductive pathway is substantially equal to a shortest distance between the die connector 154 of the fine-pitched die 150 and the contact pad 114 (i.e. a conductive feature) of the first active die 110. Such configuration may keep a short signal length in order to minimize a noise between operations and to improve a signal performance. It should be noted that although two active dies and one single fine-pitched die are illustrated in FIG. 1F, the semiconductor package may include more active dies and more fine-pitched dies corresponding to the active dies, and the amount and the configuration of the active dies and the fine-pitched dies construe no limitation in the disclosure.

Figure 2:
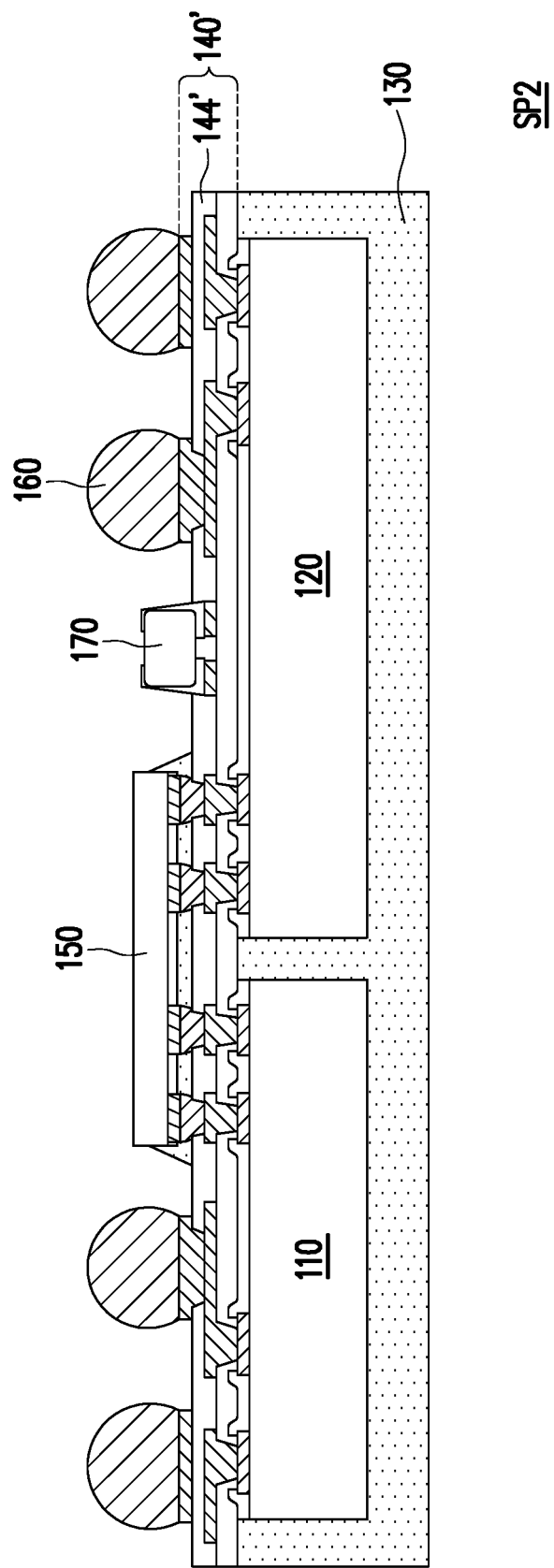
FIG. 2 is a schematic cross-sectional view illustrating a semiconductor package according to an embodiment of the disclosure.

FIG. 2 is a schematic cross-sectional view illustrating a semiconductor package according to an embodiment of the disclosure. Referring to FIG. 2, a semiconductor package SP2 is provided. The semiconductor package SP2 is similar to the semiconductor package SP1 described above, except that the semiconductor package SP2 further includes a passive component 170.

The passive component 170 may be disposed on the RDL 140' and aside the fine-pitched die 150. In some embodiments, the passive component 170 is disposed between the fine-pitched die 150 and the conductive terminals 160. The passive component 170 may be electrically coupled to the first active die 110 and the second active die 120 through the RDL 140'. For example, the patterned conductive layer 144' of the RDL 140' may be adjusted depending on the circuit requirements of the passive component 170. For example, the passive component 170 may be or may include resistors, inductors, capacitors, combinations of these, or other electrical component as desired for a particular functionality. In some embodiments, the passive component 170 is a low-profile capacitor disposed on the RDL 140' opposite to the first active die 110 or the second active die 120 for better decoupling performance. It should be noted that although only one passive component 170 is illustrated in FIG. 2, multiple passive components having the same or different function(s) may be included within the semiconductor package SP2, and the amount of the passive components depends on the required functionality of the semiconductor package SP2.

The semiconductor package SP1 or SP2 described in the disclosure may be mounted to an external device including package substrate, a printed circuit board, a system board, a mother board, or the like. For example, the electrical signals of the first active die 110 and the second active die 120 of the semiconductor package SP1 or SP2 are transmitted to the external device through the conductive terminals 160. Other applications of the semiconductor package SP1 or SP2 are possible.

Based on the above, since the semiconductor package includes the active dies and the fine-pitched die disposed in a face-to-face configuration for shortening interconnection distance therebetween, and the lower power consumption and high bandwidth of the semiconductor package may be achieved. The fine-pitched die may be utilized to provide a high density input/output (I/O) communication to interconnect the adjacent active dies. By using the manufacturing method above, homogeneous die and heterogeneous die may be integrated in a single fan-out package.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A semiconductor package, comprising:
a first active die and a second active die separately arranged,
an insulating encapsulation at least laterally encapsulating the first active die and the second active die;
a redistribution layer disposed on the insulating encapsulation, the first active die, and the second active die; and
a fine-pitched die disposed on the redistribution layer and extending over a gap between the first active die and the second active die, the fine-pitched die having a function different from the first active die and the second active die, a die connector of the fine-pitched die being connected to a conductive feature of the first active die through a first conductive pathway of the redistribution layer, wherein a first connecting length of the first conductive pathway of the redistribution layer is substantially equal to a shortest distance between the die connector of the fine-pitched die and the conductive feature of the first active die; and
a solder ball disposed on the redistribution layer and disposed next to the fine-pitched die, the solder ball being electrically coupled to the first active die through a second conductive pathway of the redistribution layer, and the second conductive pathway is more tortuous than the first conductive pathway.

2. The semiconductor package of claim 1, wherein the die connector of the fine-pitched die is partially embedded in a patterned dielectric layer of the redistribution layer.

3. The semiconductor package of claim 1, wherein the second conductive pathway of the redistribution layer is connected to the solder ball and one of the first active die and the second active die, and the first connecting length of the first conductive pathway is shorter than a second connecting length of the second conductive pathway.

4. The semiconductor package of claim 1, further comprising:
a passive component disposed on the redistribution layer and aside the fine-pitched die, and the passive component being electrically coupled to the first active die and the second active die through the redistribution layer.

5. The semiconductor package of claim 1, further comprising:
an underfill disposed between the fine-pitched die and the redistribution layer to laterally cover the die connector of the fine-pitched die.

6. The semiconductor package of claim 1, wherein a thickness of the insulating encapsulation is greater than that of the first active die and the second active die.

7. The semiconductor package of claim 1, wherein the conductive feature of the first active die is a contact pad, and the first conductive pathway of the redistribution layer is in direct contact with the contact pad.

8. The semiconductor package of claim 1, wherein
the first active die comprises a first active surface and a plurality of the conductive features distributed on the first active surface, the fine-pitched die comprises a second active surface and a plurality of the die connectors distributed on the second active surface, a first group of the conductive features of the first active die is connected to the die connectors of the fine-pitched die, and a second group of the conductive features of the first active die is not connected to the fine-pitched die, and
a distribution density of the die connectors distributed on the second active surface of the fine-pitched die is denser than a distribution density of the second group of the conductive features distributed on the first active surface of the first active die.

9. The semiconductor package of claim 8, wherein
a group of the conductive features is disposed at a periphery of the first active surface and corresponds to a die-mounting region of the redistribution layer where the fine-pithed die is disposed on, and
a pitch of the adjacent conductive features in the group substantially matches a pitch of the adjacent die connectors of the fine-pitched die disposed corresponding to the group.

10. The semiconductor package of claim 1, wherein the die connector of the fine-pitched die is partially embedded in the redistribution layer to be in direct contact with the first conductive pathway.

11. A manufacturing method of a semiconductor package, comprising:
encapsulating a plurality of active dies with an insulating encapsulation, wherein the adjacent active dies are spatially separated by a portion of the insulating encapsulation;
forming a redistribution layer on the active dies and the insulating encapsulation; and
disposing a fine-pitched die on the redistribution layer and above the portion of the insulating encapsulation, wherein die connectors of the fine-pitched die bonded to a first conductive pathway of the redistribution layer, and a connecting length of the first conductive pathway between one of the die connectors of the fine-pitched die and one of the active dies is substantially equal to a shortest distance between the one of the die connectors and the one of the active dies; and
forming a solder ball on the redistribution layer, wherein the solder ball is formed next to the fine-pitched die and is electrically coupled to at least one of the active dies through a second conductive pathway of the redistribution layer, and the second conductive pathway is more tortuous than the first conductive pathway.

12. The manufacturing method of claim 11, wherein encapsulating the active dies with the insulating encapsulation comprises disposing the active dies separately on a temporary carrier, wherein active surfaces of the active dies face towards the temporary carrier; and before forming the redistribution layer, releasing the temporary carrier from the active dies to expose the active surface of the active dies.

13. The manufacturing method of claim 11, wherein encapsulating the active dies with the insulating encapsulation comprises:

forming the insulating encapsulation to cover a sidewall and a back surface of each of the active dies, wherein the back surface is opposite to the redistribution layer, and the sidewall is connected to the back surface.

14. The manufacturing method of claim 11, wherein forming the redistribution layer comprises:

forming a patterned conductive layer over active surfaces of the active dies, wherein conductive vias of the patterned conductive layer are directly connected to contact pads of the active dies distributed on the active surfaces.

15. The manufacturing method of claim 14, wherein forming the redistribution layer further comprises:

forming a patterned dielectric layer on the patterned conductive layer to partially cover the patterned conductive layer, wherein after disposing the fine-pitched die, bottoms of the die connectors of the fine-pitched die are laterally covered by the patterned dielectric layer to be in contact with the patterned conductive layer.

16. The manufacturing method of claim 11, wherein after disposing the fine-pitched die, bottom portions of the die connectors of the fine-pitched die are embedded in a patterned dielectric layer of the redistribution layer.

17. The manufacturing method of claim 11, further comprising:

forming an underfill between the fine-pitched die and the redistribution layer to at least laterally cover the die connectors of the fine-pitched die unmasked by the redistribution layer.

18. The manufacturing method of claim 11, further comprising:

disposing a passive component on the redistribution layer and aside the fine-pitched die, wherein the passive component is electrically coupled to at least one of the active dies through the redistribution layer.

19. The manufacturing method of claim 11, wherein one of the active dies is provided with at least two contact pads having a pitch substantially matching a pitch between two of the adjacent die connectors of the fine-pitched die, and the at least two contact pads are disposed at a periphery of the active die and proximal to the portion of the insulating encapsulation.

20. The manufacturing method of claim 11, wherein when disposing the fine-pitched die on the redistribution layer, a reflow process is performed on the die connectors of the fine-pitched die.

* * * * *